(12) United States Patent
Brandl et al.

(10) Patent No.: US 7,338,839 B2
(45) Date of Patent: Mar. 4, 2008

(54) METHOD FOR PRODUCING AN ELECTRICAL COMPONENT

(75) Inventors: Manfred Brandl, Gratwein (AT); Robert Csernicska, Stainz (AT); Walter Draxler, Neutillmitsch (AT)

(73) Assignee: Austriamicrosystems AG (AT)

( * ) Notice: Subject to any disclaimer, the term of this patent is extended or adjusted under 35 U.S.C. 154(b) by 183 days.

(21) Appl. No.: 10/521,322

(22) PCT Filed: Jun. 4, 2003

(86) PCT No.: PCT/EP03/05859

§ 371 (c)(1),
(2), (4) Date: Aug. 24, 2005

(87) PCT Pub. No.: WO2004/008522

PCT Pub. Date: Jan. 22, 2004

(65) Prior Publication Data

US 2006/0141760 A1 Jun. 29, 2006

(30) Foreign Application Priority Data

Jul. 16, 2002 (DE) .............................. 102 32 190

(51) Int. Cl.
H01L 21/50 (2006.01)
H01L 21/30 (2006.01)
H01L 21/46 (2006.01)

(52) U.S. Cl. ...................... 438/113; 438/455; 438/462; 257/E21.499

(58) Field of Classification Search ........ 257/E23.001, 257/E21.499
See application file for complete search history.

(56) References Cited

U.S. PATENT DOCUMENTS

| 4,802,952 A * | 2/1989 | Kobori et al. ............... 438/51 |
| 5,668,033 A | 9/1997 | Ohara et al. |
| 5,895,233 A | 4/1999 | Higashi et al. |
| 6,407,381 B1 | 6/2002 | Glenn et al. |
| 6,555,901 B1 | 4/2003 | Yoshihara et al. |
| 6,955,976 B2 * | 10/2005 | Hartwell et al. ............ 438/456 |
| 2004/0166662 A1 * | 8/2004 | Lei ............................ 438/614 |

FOREIGN PATENT DOCUMENTS

| JP | 09223678 | 8/1997 |
| JP | 10-112548 | 4/1998 |
| JP | 2000195827 | 7/2000 |
| WO | WO98/05935 | 2/1998 |
| WO | WO01/46664 | 6/2001 |

OTHER PUBLICATIONS

English Translation of International Preliminary Examination Report for application PCT/EP2003/005859.

* cited by examiner

*Primary Examiner*—Scott B. Geyer
(74) *Attorney, Agent, or Firm*—Fish & Richardson P.C.

(57) ABSTRACT

To expose a submerged bondable terminal pad in a component that includes at least two substrates which are joined with each other, it is proposed that grooves of relatively shallow depth be provided on the connecting surface of the second substrate before the two substrates are joined. After the two substrates are joined, incisions are made opposite the grooves which open the grooves from the back side. The cutouts to be removed are defined between two grooves.

19 Claims, 3 Drawing Sheets

METHOD FOR PRODUCING AN ELECTRICAL COMPONENT

TECHNICAL FIELD

This patent application relates to a method for producing submerged bondable terminal pads on a component which includes at least two interconnected substrates.

BACKGROUND

It is known from published patent specification WO98/05935A1 that sensors can be placed on a substrate in such a way that the sensor elements are positioned over an opening in the substrate. It is known from published patent specification JP 2000195827A as well as in the quotation in Patent Abstracts of Japan to place grooves on one side of a substrate, and in order to separate the LED components formed on a wafer to make incisions from the back side of the substrate over the grooves to such a depth that the grooves are opened. In the case of two connected substrates, it is known from published patent specification JP09223678A that the procedure is to remove cutouts from a second substrate to separate the components.

Examples of components that are realized in two connected substrates are so-called COC (chip on chip) components which have a type of vertical integration. The two substrates which both component structures can have are interconnected through two main surfaces, while at the same time, if necessary, an electrical contact can be established between component structures in different substrates. The component can have common or separate electrical contacts for both connected substrates. If there are electrical contacts on both substrates, the mutual electrical connection of the component structures realized in the two substrates can also be made by bonding wires between the respective contacts.

The COC technology is employed for component encapsulation at the chip level, also known as "first level packaging". It is also used where further miniaturization of the components is desired, and where components with less need for space on a circuit board or in a module are sought. The technology is used in particular to produce ICs, micromechanical components or sensors (MEMS), as well as for producing micro-optical components.

The substrates of the COC components are usually produced by integrated methods at the wafer level, and the two component substrates are also connected at the wafer level. It is therefore necessary, on the lower of the two substrates, or in the case of a larger number of substrates, on a lower substrate, to expose the electrical terminal pads after the two substrates have been connected, and, for example, to produce a window in the top substrate. If the window is produced after the two substrates are connected, there is a danger that the process of opening the window to expose the contacts (terminal pads) will cause the latter or other structures on the lower of the two substrates to be damaged or even destroyed.

It is therefore known and usual to form the windows in which the terminal pads are exposed in the upper one of the two wafers before the substrates are connected. In the case of semiconductor wafers, that can be done for example by anisotropic etching from one or two sides of the top wafer. As the etching technique, it is possible for example to employ reactive ion etching. However, a disadvantage of the method is that the top substrate is weakened as a result of the pre-produced window, possible breaking points are already predefined as with the windows. This is disadvantageous for the joining of the two wafers, which takes place in particular under pressure. The result of this is that COC technology, in which two substrates are joined together by bonding, is limited at the wafer level to wafers with a diameter of four to a maximum of six inches.

An additional disadvantage of this method is that precisely located etch-through of the windows requires a great expenditure of time and processing.

SUMMARY

In contrast to the known method, in which the windows in the top substrate are produced in a complicated step by etching before the two substrates are joined, the exposure of the terminal pads is performed according to the method described herein.

A first step, which is performed before the substrates are joined, includes producing grooves in the surface of the second (upper) substrate. These grooves define and delimit a cutout in which the terminal pads of the first or lower substrate are later exposed. The grooves are produced to a specified depth, which corresponds to only a fraction of the total thickness of the substrate.

The first substrate, which has on its surface the forenamed terminal pad for component structures located in the first substrate, is then joined with the second (upper) substrate in such a way that the surface of the second substrate with the grooves faces the surfaces of the first substrate that has the terminal pads.

Next, incisions are made from the back side of the second upper substrate in the area over the grooves; these incisions extend to a depth such that in the incisions the grooves are opened along their entire length. The incisions may be made parallel to the grooves, or directly over the grooves and following the course of the grooves.

The method described herein has the advantage that, because of the only slight depth of the grooves, the top wafer retains sufficient strength, significantly lowering the risk of a substrate or wafer break compared to the known method. The method has the additional advantage that the more complicated sub-step of the method, namely the production of the grooves, can be performed significantly more quickly and with less complication because of their shallow depth. Producing the incisions from the back side on the other hand can now be done using a more cost-effective, simpler and possibly more imprecise method, for example by sawing.

After the grooves have been opened in the incisions, the second substrate is severed in the area of the cutout, so that the cutout can be removed, which produces the desired window in which the terminal pads are exposed.

If a sawing procedure is used to produce the incisions, and if for example a diamond saw is used, it is advantageous to produce the incisions as straight-line cuts. Correspondingly, straight-line grooves are also provided in the opposing surface of the second substrate. Matching this, the terminal pads may be arranged side-by-side in a row, so that with a single cutout or with two incisions an elongated window that extends over the entire substrate can be opened, in which one or more rows of terminal pads can be exposed in a single step.

A row of terminal pads can belong to one or more components positioned side-by-side on the first substrate.

The grooves can be produced using any desired procedure which can be carried out with structure and control in such a way that precisely positioned grooves of a desired groove depth can be produced. It is possible for example to define the grooves by a resistance mask which is photolithographically structured. With the resistance mask, a structured etching process is then carried out, in which material is removed in the areas not covered by the resistance mask until a desired or prescribed groove depth has been reached. For the etching process, it is possible to use wet chemical etching, ion beam etching or plasma-enhanced etching. The etching can be done isotropically or anisotropically, since the groove profile and groove width have almost no influence on the quality of the component produced with the method described herein. In anisotropic methods, less material needs to be removed, which reduces the expense of the etching process.

The reason that the width of the grooves has no influence on the result of the process is that the grooves serve merely to define the cutout, and because all that has to happen in the grooves is a separation of the substrate to the depth of the grooves. A groove width is advantageous which produces reliable separation to the desired depth, so that after the incisions have been made no bridges of material remain between the cutout and the remaining substrate.

Advantageously, measures are provided that guarantee easy detachment or complete removal of the cutout, that is, of the area of the second substrate that is defined between the grooves and that forms the window for exposing the terminal pads. One possibility for this is to provide a free space over the terminal pads, which also ensures a clear interval between the terminal pads and the adjacent surface of the second wafer after the substrates have been joined.

To ensure such a clear interval, in at least one of the two substrates a structure can be produced on one of the two opposed surfaces which serves as a spacer beyond the window. It is also possible to provide a corresponding depression under the terminal pads in the first substrate or over the terminal pads in the second substrate.

An additional possibility for simplifying the complete removal of the cutout is to provide a cover over the terminal pads in the area of the cutout, which prevents direct adherence of the second substrate to the terminal pads when the two substrates are joined. Covers may be used that can be removed easily after the cutout has been opened, and which therefore should exhibit little or no adhering to the two substrates. Suitable as covers therefore are coatings or coating materials that develop only weak adhesion forces on the substrate, or which produce a layer with only weak internal cohesion, so that it is possible to remove the cutout easily.

It is also possible to employ methods for joining the two substrates which result intentionally and selectively in the production of a firm connection between the two substrates only at desired connecting surfaces. These include procedures in which a connecting material is applied to one of the two substrates to produce the connection. Examples of these are glass bonding, bonding by bumps, eutectic bonding and to a certain degree also anodic bonding. With these connecting procedures it is not necessary to ensure a free clearance of the two substrates over the terminal pads or to provide a cover layer over the terminal pads. These methods can be carried out in such a way that the connecting positions of the two substrates occur outside of the surfaces of the substrates intended for the terminal pads. Also suitable for joining the two substrates is a glue, and if the substrates include semiconductor material, direct bonding of these semiconductor materials. To that end, they are aged at a high temperature, which produces a firm connection of the semiconductor surfaces that come into contact with each other.

Embodiments are explained in greater detail on the basis of exemplary figures. The figures represent only schematic portrayals; they are not executed true to scale, and can reproduce only parts of specific embodiments.

DETAILED DESCRIPTION

Figure 1:
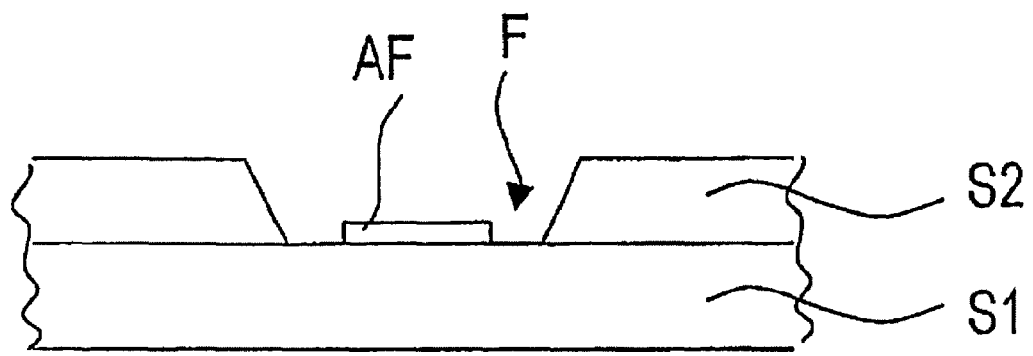
FIG. 1 shows a schematic cross section of a known COC component.

FIG. 1 portrays a schematic cross section of a known chip-on-chip component. The component is made up of a first substrate S1 and a second substrate S2 connected to it, which are joined with known bonding technologies. At least the lower first substrate S1 contains component structures which are electrically connected with the outside world via the terminal pad AF on the top of the lower substrate S1. In order for the latter to be accessible from the outside in the two-layer component, the second substrate S2 has a window in the area of the terminal pad AF, in which the terminal pad AF is exposed. The window in the second substrate S2 is produced by etching technologies before the two substrates are joined.

Figure 2:
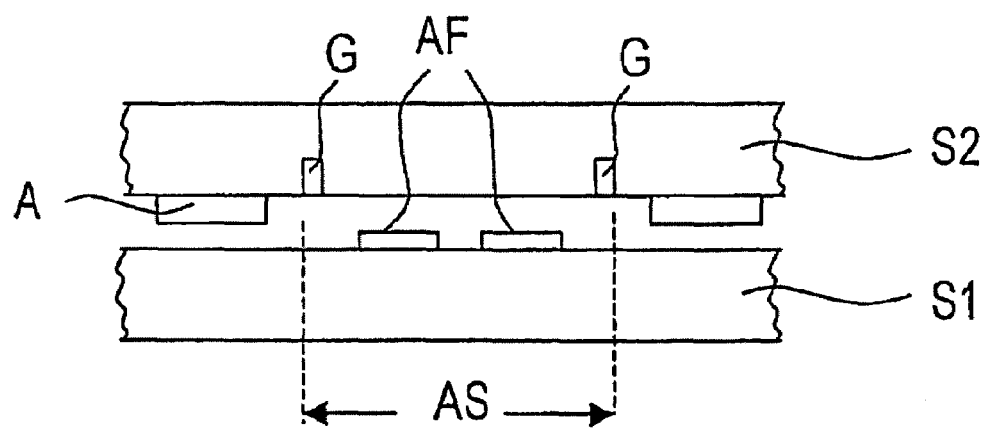
FIG. 2 shows a schematic cross section of two substrates which are to be joined.

FIG. 2: The following procedure is used in a component made up of at least a first substrate S1 and a second substrate S2. Grooves G are produced in the second substrate S2 with an etching technique. Between two straight-line grooves or within a circular closed groove structure, a cutout AS is defined which corresponds to the size of the window which will be opened later. On the surface of the first substrate S1 there are terminal pads AF, for example solderable contacts. At least one of the two substrates has on one of the surfaces to be joined a spacing structure A, which in the present case for example represents the connecting point between the two substrates S1 and S2. The spacing structure A can be for example a bump, a metallizing for eutectic bonding, or an application of glue. The spacing structure A can be made by structuring the surface of one of the substrates. To that end one of the substrate surfaces is structured by etching in such a way that a suitably higher level is produced at the points intended for bonding, compared to the rest of the surface of the substrate.

Figure 3:
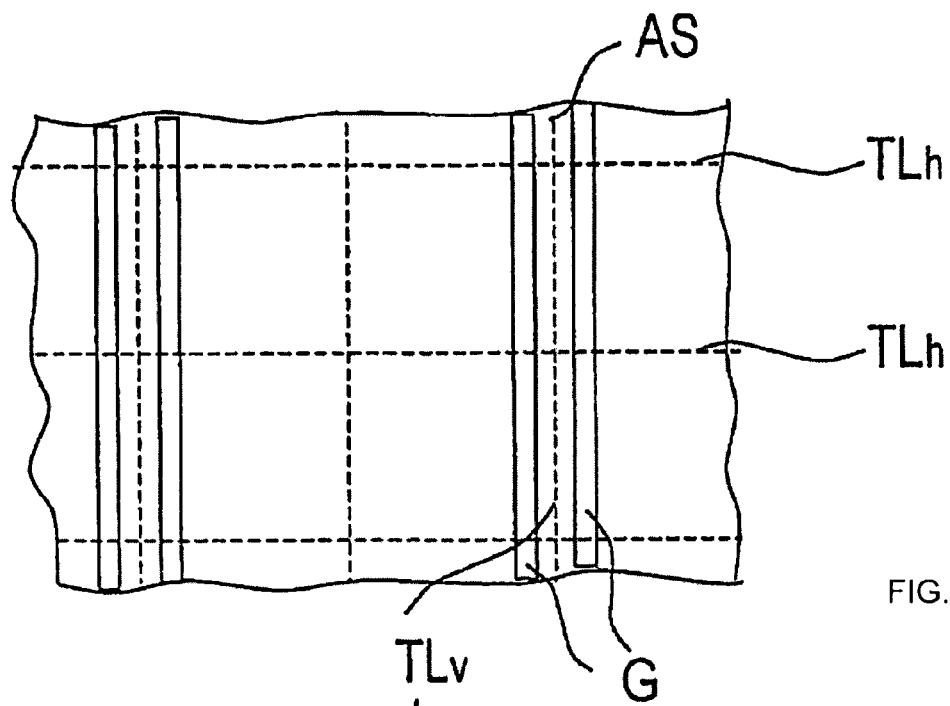
FIG. 3 shows the arrangement of the grooves on the second substrate.

FIG. 3 shows the substrate S2 in a top view of the surface in which the grooves G are arranged. In the substrate, in which a plurality of individual components are realized, the boundaries between the future individual components are identified by dashed separating lines $TL_h$ and $TL_v$. The grooves G may run in straight lines over the entire substrate and are arranged in pairs in such a way that they define a strip-shaped cutout AS between them. The strip-shaped cutout AS may be positioned directly over a separating line $TL_v$, so that the cutout AS covers the edge areas of two adjacent individual components. With the structuring shown in FIG. 3, only one strip-shaped cutout AS is produced in each individual component. It is also possible, however, to produce two or more of the cutouts per individual component, if a larger number of terminal pads need to be exposed in them.

Figure 4:
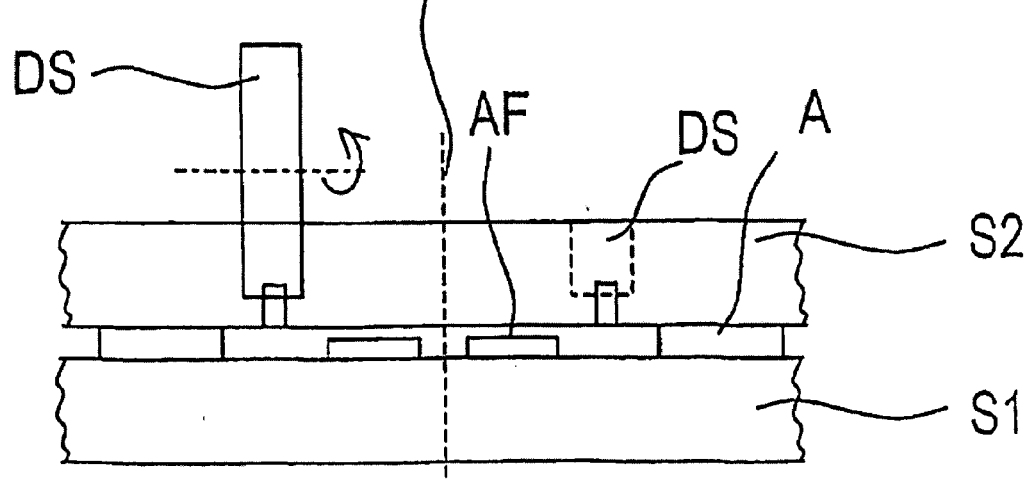
FIG. 4 shows a schematic cross section of the components during production of the incisions.

After the grooves G have been produced, the two substrates S1 and S2 are joined with each other according to a known method, in particular a wafer bonding method or by gluing. In the example shown in FIG. 4, the connection is made through the structures A. It is also possible however to join the two substrates over a large area, and to that end in particular to position the terminal pads AF in an indentation. It is also possible to provide an indentation in the second substrate S2 over the terminal pads AF.

With the help of a saw, such as a diamond saw DS, which is represented in the figure only schematically as a rotating disk, an incision ES is now produced over the grooves G from the back side of the second substrate S2 opposite the grooves. The incision ES is made to a depth such that the particular groove is opened from the back side. In this way, the second substrate S2 is completely severed parallel to the grooves.

The two-stage execution of the separation has the advantage that the incisions can be produced with a substantially more imprecise tool, which would not be usable to carry out the separation simply because of the relatively great deviation in the depth of the incision. The resulting lower limit for the depth of the groove is therefore that the depth of the groove should at least correspond to the tolerance which corresponds to the tool for producing the incisions, in particular the diamond saw DS. If there is sufficient free clearance because of a particular configuration of the surface topology of the two substrates on the connecting side between the top rim of the grooves in the second substrate and the surface of the first substrate below it, the depth of the groove can be reduced by that amount. High quality diamond saws used today have an incision depth tolerance of more than 20 µm, normally 50-60 µm. As a result, the depth of the grooves may correspond to the maximum sustainable tolerance of the saw. If both substrates S1, S2 are semiconductor wafers which have for example a thickness of 500 µm, then the necessary groove depth for the forenamed high-quality saws is for example only about 10% of the thickness of the layer. This results in only a trivial degrading of the strength of the wafer. The greater mechanical strength of the substrate S described herein makes it possible then to use larger wafers for the production of COC components, or better of stacked wafer components in general, without fear of a greater danger of breakage during the manufacturing and processing procedure, in particular in the case of wafer bonding. The second incision ES is represented in the figure only by dashed lines.

The figure shows directly an additional advantage of the method described herein. The width of the cut when producing the incisions can be chosen at will, simplifying the adjustment of the incisions relative to the grooves. It is even possible to use a tool for producing the incisions whose width of cut corresponds to the width of the cutout, i.e., to the distance between the grooves. In this way, a single incision is sufficient for a cutout, in order to open the window to expose the terminal pads AF. However the forenamed diamond saws DS normally have a cutting width of only about 30-100 µm, whereas a sufficient width of the cutout AS according to present-day wire bonding technology should be at least 0.5 mm, but may be 1 to 3 mm.

Figure 5:
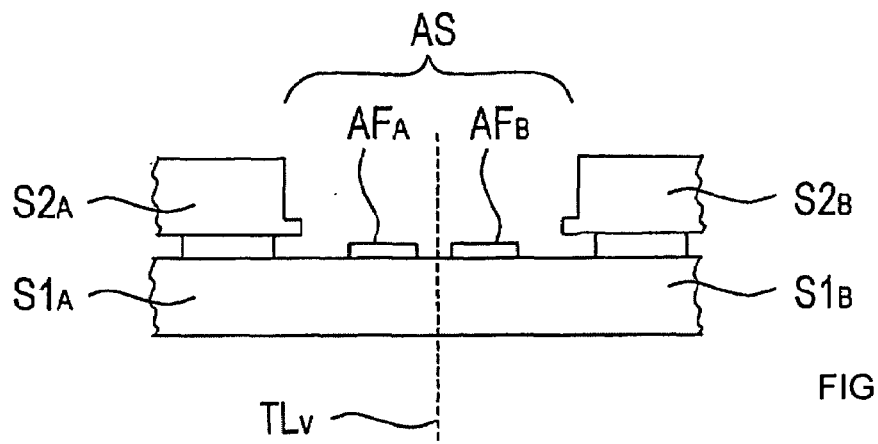
FIG. 5 shows the component after the incisions.

After the incisions have been completed, the substrate strip corresponding to the cutout AS is completely severed from the rest of the substrate S2 and can be removed. In the resulting window F the terminal pads AF are now exposed, as shown in schematic cross section in FIG. 5, and because of the appropriate width of the cutout AS they are readily accessible for a soldering process. In the figure there are two terminal pads in the window F, which belong to different components are identified correspondingly by indices A and B. The separating line $TL_v$, along which the two components will later be separated, is sketched in with dashed lines.

Figure 6:
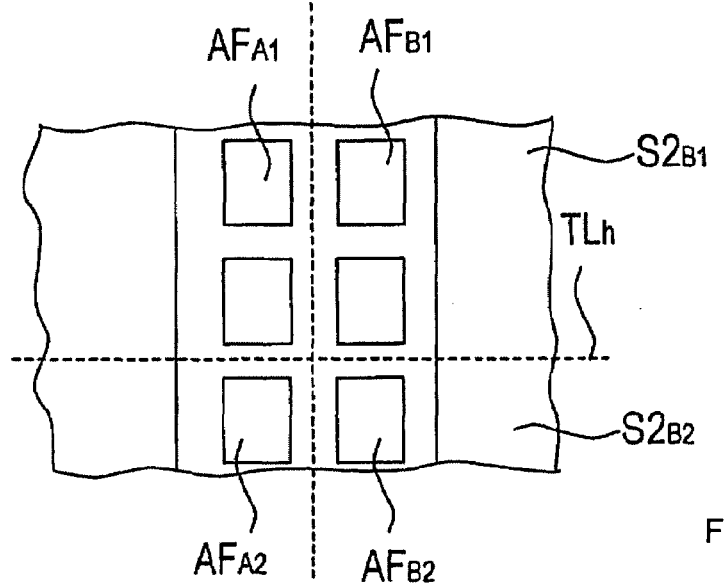
FIG. 6 shows a top view of the terminal pads exposed on the first substrate.

FIG. 6 shows a top view of the arrangement at this stage of the procedure. In the selected section of the component, which is larger overall, there is a crossing of two separating lines $TL_v$, $TL_h$, so that the abutting corners of four individual components are shown here. For each individual component there can be any number of terminal pads provided, depending on the type of component. For each wafer (substrate) the number of individual components is limited essentially by the size of the individual components, but is otherwise open.

At this stage, it is now already possible to test the individual components for their functionality, and to that end in particular to provide the terminal pads AF with corresponding contacts. It is also possible, however, to separate the components directly. This can be done in two stages, with the arrangement being separated with the help of a suitable separating tool, for example the forenamed diamond saw, along the separating lines TL of one sort, for example $TL_v$, into individual strips, with each strip containing a row of joined components. The electrical test of the individual components can also be done at this stage, before they are subsequently separated into individual components along the second separating lines $TL_h$.

Figure 7:
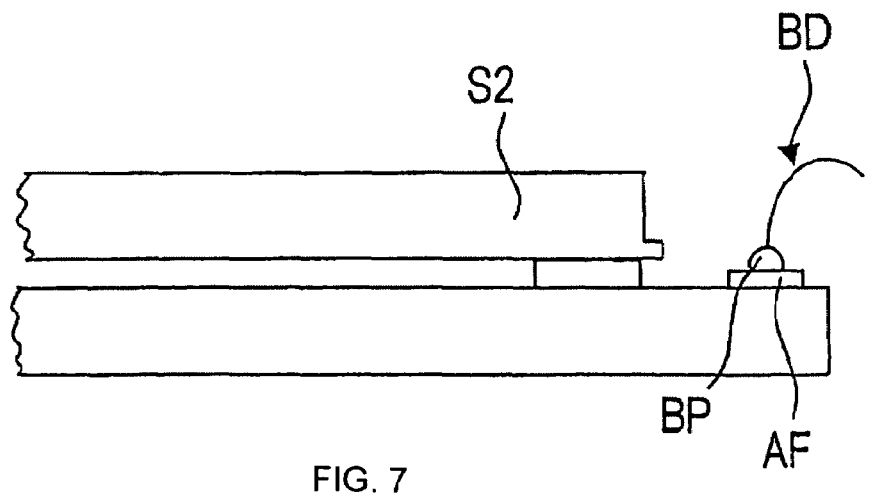
FIG. 7 shows an individual component after separation.

FIG. 7 shows part of an individual component after separation. It can readily be seen that the terminal pads AF are adjacent in the edge area of the particular component or its first substrate. The figure also shows now the terminal pads are connected to a bonding wire (BD) with the help of a metallic connection, for example a bump BP, and make outside contact, for example on a circuit board. The positioning of the terminal pads AF on the edge has the advantage that the bonding wire can be routed from the edges of the second substrate S2 without motion. If additional contacts are provided on the second substrate S2 for component structures within the second substrate, this eliminates the danger of an unwanted short circuit.

With the help of the method described herein, the submerged terminal pads of a great variety of components can be exposed, which were originally covered during production under two substrates that were joined together over a large area. Accordingly, the component can be formed in only one substrate; in particular in the first substrate S1, and the second substrate S2 can therefore be for example a cover for the component. In all cases the two substrates are ceramic, glass-like or crystalline, but in any case rigid, firm bodies with large surfaces. There can also be a vacuum or any desired gaseous atmosphere enclosed in cavities which may be formed between the two substrates S1 and S2. At least one of the two substrates can also have micromechanical or micro-optical component structures. The component may therefore be an IC, a sensor, a MEMS Sensor for pressure, acceleration or speed of rotation, a micro-optical component such as a photo sensor array with a glass cover, or any other component that includes two substrates joined to each other.

In an additional embodiment, which is not shown, the component has a structure comprised of more than two stacked substrates. The third and additional substrates can be placed on the surface of the first or the second substrate. The additional substrates may be joined with one of the two other substrates or with the composite of the two substrates between the procedural stages shown in FIGS. 2 and 4. A third or additional substrate, lying with its whole surface on the second substrate S2, can form a unit with the second substrate, which unit is treated like a single second substrate and is completely severed when the incision ES is produced.

The invention claimed is:

1. A method of producing a component comprised of at least first and second substrates, the first substrate having an upper surface that contains terminal pads, and the first substrate comprising component structures that are electrically conductive and that are electrically connected to the terminal pads, the second substrate having a lower surface that faces the upper surface of the first substrate, the method comprising:
forming grooves having a predefined depth on the lower surface of the second substrate;
forming incisions on an upper surface of the second substrate, the incisions reaching the grooves to form a cutout portion in the second substrate; and
removing the cutout portion to expose the terminal pads;
wherein the grooves and the incisions are formed in substantially straight lines on the second substrate;
wherein the incisions are formed by sawing; and
wherein the cutout portion is defined between a pair of grooves.

2. The method of claim 1, wherein the terminal pads are positioned side by side in a row on the upper surface of the first substrate; and
wherein the cutout portion exposes the row of terminal pads.

3. The method of claim 1, wherein the grooves are formed via wet chemical etching, ion beam etching, or plasma etching.

4. The method of claim 3, wherein the grooves are defined by a resistance mask that is structured photolithographically.

5. The method of claim 1, wherein the grooves are formed by laser cutting.

6. The method of claim 1, wherein the grooves are formed to a depth that is greater than a cutting depth precision of a sawing process used to form the incisions.

7. The method of claim 1, further comprising:
joining the first and second substrates; and
shaping at least one of the first and second substrates to produce a clearance between the terminal pads and the second substrate.

8. The method of claim 7, further comprising:
before joining the first and second substrates, applying a covering over at least the terminal pads to prevent the second substrate from adhering to the terminal pads; and
removing the covering after removing the cutout portion.

9. The method of claim 7, wherein the first and second substrates are joined via glass bonding, bonding using bumps, anodic bonding, eutectic bonding, direct bonding of substrate surfaces, or gluing.

10. The method of claim 1, wherein the first and second substrates comprise wafers; and
wherein the method further comprises separating individual components from the first and second substrates after the cutout portion is removed.

11. The method of claim 10, wherein terminal pads of individual components are on edges of the individual components; and
wherein removal of the cutout portion exposes two adjacent rows of terminal pads for adjacent components.

12. The method of claim 1, wherein at least one of the first and second substrates comprises microelectrical components, micro-optical components, micro-mechanical components, or a combination thereof.

13. A method of producing a component comprised of first and second substrates that are joined via an upper surface of the first substrate and a lower surface of the second substrate, the upper surface of the first substrate containing terminal pads, and the first substrate comprising component structures that are electrically conductive and that are electrically connected to the terminal pads, the method comprising:
forming grooves having a predefined depth on the lower surface of the second substrate, the grooves being formed in substantially straight lines via a first formation technique, a pair of the grooves defining a strip-shaped cutout portion of the second substrate;
joining the upper surface of the first substrate and the lower surface of the second substrate;
forming incisions on an upper surface of the second substrate via a second formation technique, the incisions reaching the grooves to separate the cutout portion from a remainder of the second substrate, the first formation technique differing from the second formation technique, and the first formation technique having greater precision than the second formation technique; and
removing the cutout portion to expose the terminal pads.

14. The method of claim 13, wherein the grooves are formed via wet chemical etching, ion beam etching, or plasma etching.

15. The method of claim 13, wherein the grooves are defined by a resistance mask that is structured photolithographically.

16. The method of claim 13, wherein the grooves are formed by laser cutting.

17. The method of claim 13, further comprising:
shaping at least one of the first and second substrates to produce a clearance between the terminal pads and the second substrate.

18. The method of claim 13, further comprising:
before joining the first and second substrates, applying a covering over at least the terminal pads to prevent the second substrate from adhering to the terminal pads; and
removing the covering after removing the cutout portion.

19. The method of claim 13, wherein the first and second substrates are joined via glass bonding, bonding by means of bumps, anodic bonding, eutectic bonding, direct bonding of substrate surfaces, or gluing.

* * * * *